US012275241B2

(12) United States Patent
Saito

(10) Patent No.: US 12,275,241 B2
(45) Date of Patent: Apr. 15, 2025

(54) SEMICONDUCTOR STORAGE APPARATUS AND PRINTING APPARATUS

(71) Applicant: Canon Kabushiki Kaisha, Tokyo (JP)

(72) Inventor: Takaaki Saito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 187 days.

(21) Appl. No.: 18/161,952

(22) Filed: Jan. 31, 2023

(65) Prior Publication Data

US 2023/0286263 A1 Sep. 14, 2023

(30) Foreign Application Priority Data

Mar. 4, 2022 (JP) ................................ 2022-033788

(51) Int. Cl.
*B41J 2/045* (2006.01)
*G11C 17/16* (2006.01)

(52) U.S. Cl.
CPC ....... *B41J 2/04541* (2013.01); *B41J 2/04536* (2013.01); *B41J 2/0458* (2013.01); *B41J 2/04581* (2013.01); *G11C 17/16* (2013.01)

(58) Field of Classification Search
CPC ............... B41J 2/04543; B41J 2/04546; B41J 2/04541; B41J 2/0458; B41J 2/04581; B41J 2/04586; B41J 2/1601; B41J 2/1607; B41J 2/1626; G06F 3/1293; G11C 7/10; G11C 16/26
See application file for complete search history.

(56) References Cited

U.S. PATENT DOCUMENTS

2018/0061506 A1* 3/2018 Fujii ....................... G11C 17/16
2018/0281390 A1* 10/2018 Fujii ................... H01L 23/5252

FOREIGN PATENT DOCUMENTS

JP            6608269 B2    11/2019

* cited by examiner

*Primary Examiner* — Thinh H Nguyen
(74) *Attorney, Agent, or Firm* — Venable LLP

(57) ABSTRACT

A semiconductor storage apparatus comprising a memory unit including one or more memory devices, the semiconductor storage apparatus further comprising a first resistance connected in series to a power line that supplies a writing voltage to the memory unit, a second resistance connected in parallel to the first resistance via a drive element, and a control unit configured to control the drive element to be driven into conduction to allow current to flow through the first resistance and the second resistance when a memory device of the one or more memory devices of the memory unit is selected.

14 Claims, 4 Drawing Sheets

SEMICONDUCTOR STORAGE APPARATUS AND PRINTING APPARATUS

BACKGROUND OF THE INVENTION

Field of the Invention

The present invention relates to a semiconductor storage apparatus including an anti-fuse element and a printing apparatus.

Description of the Related Art

In recent years, an inkjet printing apparatus uses a one time programmable (OTP) memory for storing product-unique information such as chip ID or setting parameters after completion of the product. There are two types of OTP memory, namely, one using a fuse element and the other using an anti-fuse element. Of the two types of memory, the OTP memory using an anti-fuse element needs to be provided with sufficient electrical energy (current stress) by applying a voltage, in a form of a pulse, to the gate insulating film, in order to stably read information written therein.

However, application of a large surge current or the like caused by electro-static discharge (ESD) or the like may destroy the gate insulating film of the anti-fuse element before data is written thereto. As a result, there has been a problem of writing of unintended data. Japanese Patent No. 6608269 therefore discloses a configuration in which a diffusion resistance is connected in series to an anti-fuse element to protect the anti-fuse element from a voltage higher than the writing voltage.

In the aforementioned configuration of the conventional technology, whereas diffusion resistance protects the anti-fuse element from ESD that may accompany high voltage, it becomes an obstacle when reading and writing data. In other words, there may occur a certain degree of reduction of electric responsiveness when reading the data written in the anti-fuse element, or a certain degree of loss of electrical energy when writing data. The foregoing prevents reducing the reading time of the anti-fuse element to improve the productivity, or increasing the writing energy efficiency to improve the writing quality. In particular, there has been a problem that increasing the writing voltage in order to improve the writing quality results in an increased resistance value of the power line for applying writing voltage due to characteristics of diffusion resistance, with the influence of which significantly outstanding.

The present invention solves at least one of the problems of the aforementioned conventional technology.

SUMMARY OF THE INVENTION

The present invention provides technology that facilitates fast and highly efficient reading and writing data from and to a memory device while maintaining the ESD resistance of the memory device.

According to one aspect of the present invention, there is provided a semiconductor storage apparatus comprising a memory unit including one or more memory devices, the semiconductor storage apparatus further comprising a first resistance connected in series to a power line that supplies a writing voltage to the memory unit, a second resistance connected in parallel to the first resistance via a drive element, and a control unit configured to control the drive element to be driven into conduction to allow current to flow through the first resistance and the second resistance when a memory device of the one or more memory devices of the memory unit is selected.

Further aspects of the present invention will become apparent from the following description of exemplary embodiments with reference to the attached drawings.

BRIEF DESCRIPTION OF THE DRAWINGS

The accompanying drawings included in the specification and forming a part thereof to illustrate embodiments of the present invention are used to explain the principle of the present invention together with description thereof.

DESCRIPTION OF THE EMBODIMENTS

Figure 1:
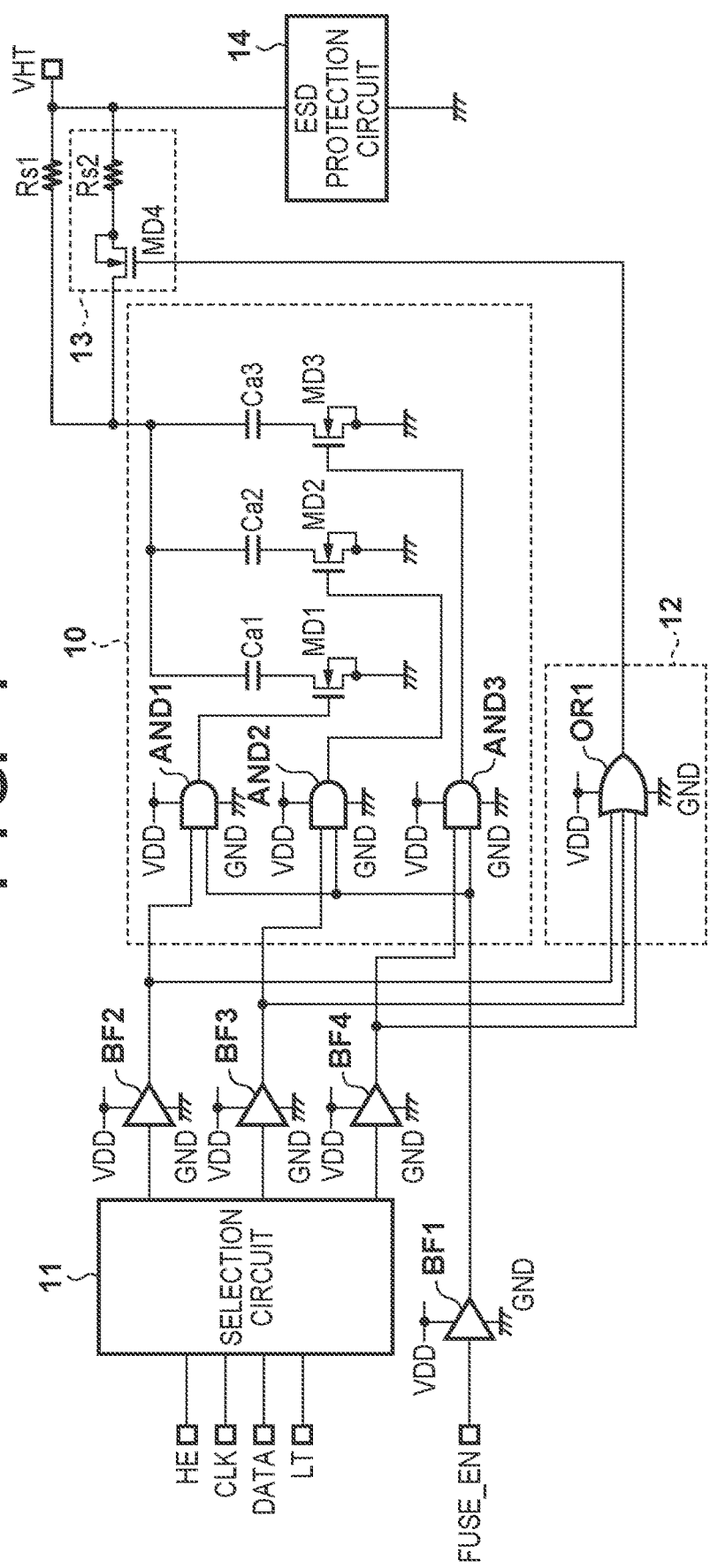
FIG. 1 is a block diagram illustrating an example of a circuit configuration of a semiconductor storage apparatus on a printing element substrate of an inkjet print head according to a first embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Although the present invention will be described taking a semiconductor substrate mounted on a thermal print head as an example, the present invention is not limited thereto and can be applied to a semiconductor substrate of a piezoelectric print head, for example.

First, embodiments of the present invention will be described, referring to FIGS. 1 to 3 and FIG. 4.

Figure 4:
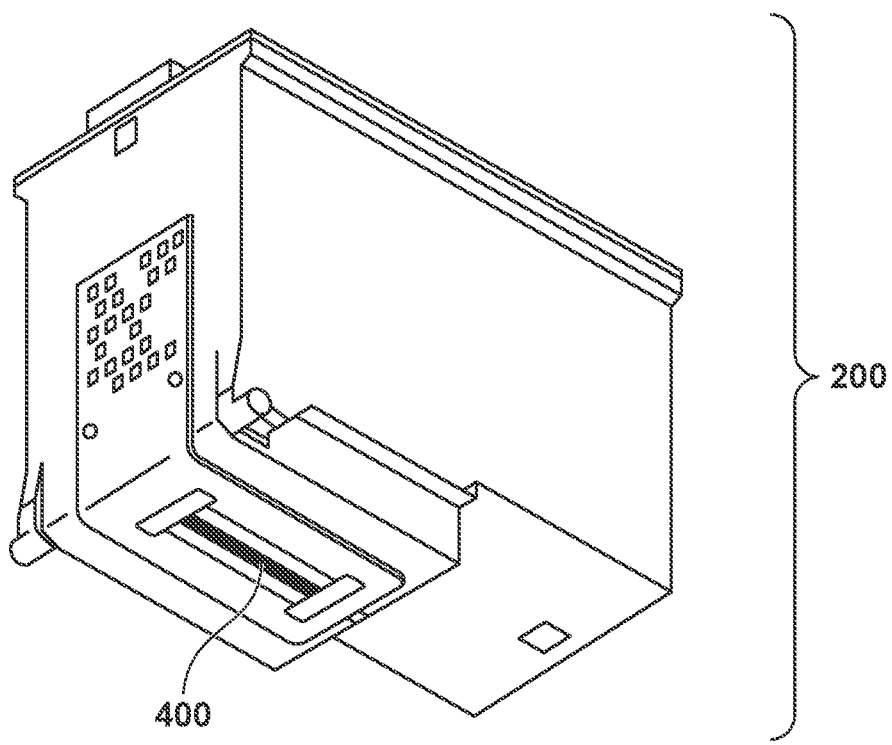
FIG. 4 is a perspective view illustrating a liquid discharge head (print head) of a printing apparatus according to embodiments of the present invention.

FIG. 4 is a perspective view illustrating a liquid discharge head (print head) 200 of a printing apparatus according to an embodiment of the present invention.

The liquid discharge head 200 has formed thereon a single printing element substrate 400 for discharging liquid. The printing element substrate 400 has a semiconductor storage apparatus having a memory unit or the like described below, and a heater (not illustrated) or the like for heating ink, and performs printing by heating the ink to generate bubbles in the ink and by discharging liquid from a discharge port (not illustrated).

In the specification, "printing" is not limited to forming meaningful information such as characters or figures. The form of printing has nothing to do with whether being meaningful or meaningless, or whether being manifested in a manner visually perceivable by a human. Printing is intended to represent formation of an image, a design, a pattern, or the like on a printing medium, or processing a medium in a broad sense.

First Embodiment

FIG. 1 is a block diagram illustrating an example of a circuit configuration of a semiconductor storage apparatus on a printing element substrate of an inkjet print head according to a first embodiment of the present invention. Here, omitted in the drawing are: a heater for heating ink, a driving circuit thereof, or the like.

The inkjet print head according to the first embodiment has a memory unit 10 provided thereon. The memory unit 10 has anti-fuse elements (memory devices) Ca1 to Ca3 connected in parallel. A heat enable (HE) signal terminal, a clock signal (CLK) terminal, a data signal (DATA) terminal, and a latch signal (LT) terminal are connected to input ends of a selection circuit 11. Based on the input signals, the selection circuit 11 controls access to the memory unit 10 via buffers BF2 to BF4. The selection circuit 11 outputs a high-level signal to one of the buffers BF2 to BF4 to select a corresponding one of the anti-fuse elements Ca1 to Ca3 of the memory unit 10.

In addition, a fuse enable signal (FUSE_EN) terminal is connected to AND circuits AND1 to AND3 of the memory unit 10 via the buffer BF1.

Output ends of the buffers BF2 to BF4 and the fuse enable signal (FUSE_EN) output end are connected to the AND circuits AND1 to AND3 of the memory unit 10 and, an output from one of the AND circuits AND1 to AND3 in which signals from both output ends reach a high level rises to a high level. As a result, one of transistors MD1 to MD3 that works as a corresponding drive element becomes conductive. The transistor becoming conductive allows for writing and reading information to and from the corresponding anti-fuse element Ca.

When writing information to an anti-fuse element, writing voltage supplied from the VHT terminal via the power line is applied to the anti-fuse element. A first protection resistance Rs1 is connected in series between the VHT terminal and the memory unit 10 to protect the anti-fuse elements from a sudden high voltage caused by ESD. In addition, an ESD protection circuit 14 is connected in series between the VHT terminal and the ground (GND). The ESD protection circuit 14 acts to release current to the ground (GND) when a high voltage caused by ESD is applied.

Furthermore, a bypass circuit 13 is connected in parallel with the first protection resistance Rs1. In the bypass circuit 13, a second protection resistance Rs2 and a transistor MD4 are connected in series. The transistor MD4 is driven into conduction by inputting a high-level signal from a bypass circuit control unit 12. The bypass circuit control unit 12 has an OR circuit OR1 intended to receive output signals of BF2 to BF4 which are collectively the output from the selection circuit 11. Therefore, the OR circuit OR1 outputs a high-level signal when a signal is output for selecting one of the anti-fuse elements Ca1 to Ca3. As a result, selecting at least one of the anti-fuse elements Ca1 to Ca3 brings the transistor MD4 into conduction, with the first protection resistance Rs1 and the second protection resistance Rs2 being connected in parallel. The foregoing allows for reducing the drop amount of the voltage supplied from the VHT terminal to the anti-fuse elements Ca1 to Ca3.

According to the first embodiment as has been described above, the amount of voltage drop when accessing the anti-fuse element can be reduced by reducing the resistance value of the protection resistance connected between the VHT terminal for supplying voltage to the anti-fuse element and the anti-fuse element at the time of accessing the anti-fuse element.

Second Embodiment

Figure 2:
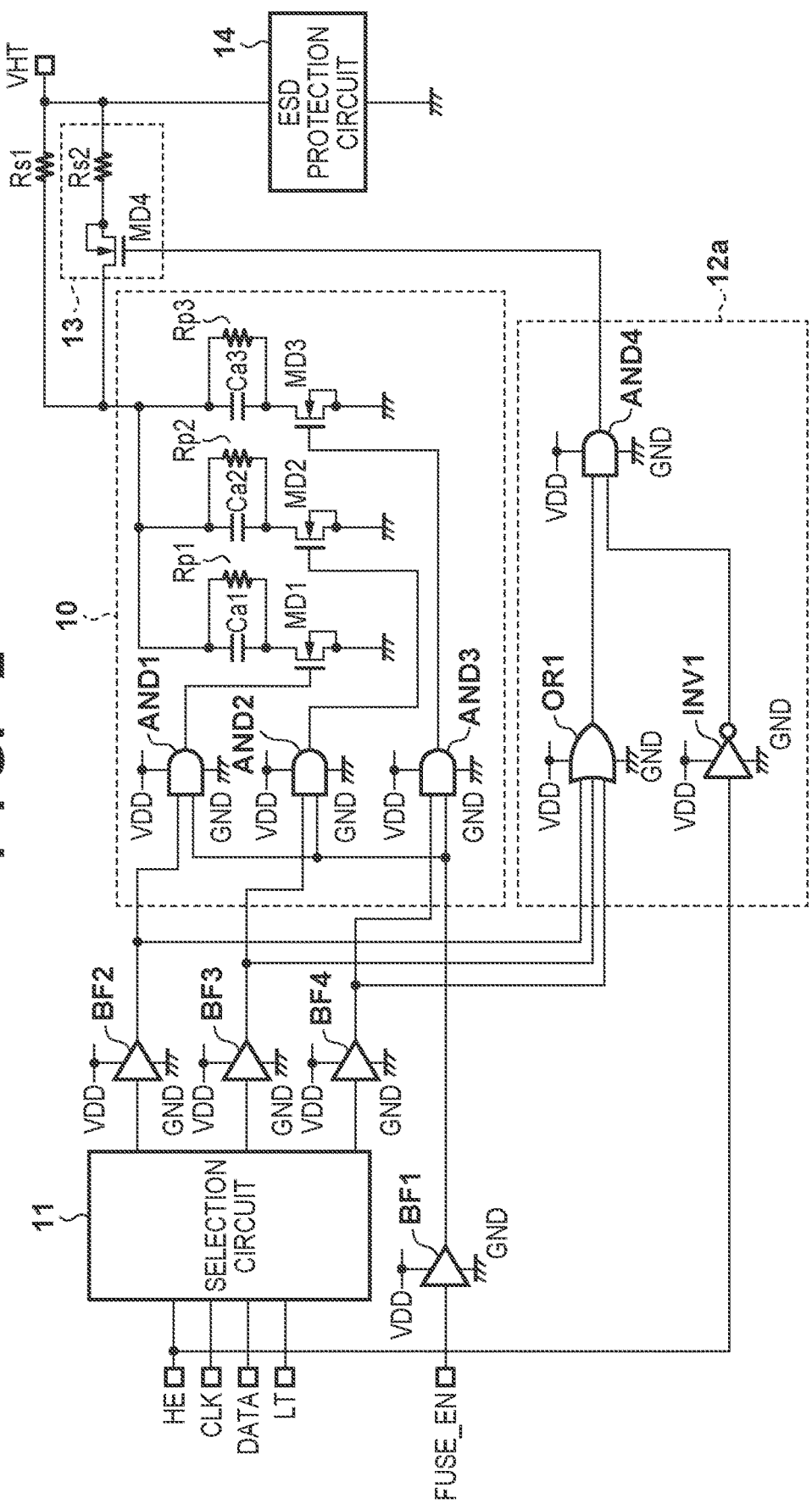
FIG. 2 is a block diagram illustrating an example of a circuit configuration of a semiconductor storage apparatus on a printing element substrate of an inkjet print head according to a second embodiment of the present invention.

FIG. 2 is a block diagram illustrating an example of a circuit configuration of a semiconductor storage apparatus on a printing element substrate of an inkjet print head according to a second embodiment of the present invention. In FIG. 2, components identical to those of FIG. 1 described above are provided with same reference numbers or reference signs, and description thereof will be omitted.

The difference from FIG. 1 lies in the configuration of a bypass circuit control unit 12a that powers the transistor MD4 of the bypass circuit 13 and the timing of powering the transistor MD4.

The bypass circuit control unit 12a has the aforementioned OR circuit OR1 and an inverter circuit INV1, and an AND circuit AND4 that receives signals output from the OR circuit OR1 and the inverter circuit INV1. The inverter circuit INV1 inverts the heat enable (HE) signal and outputs the inverted signal to the AND circuit AND4. Therefore, in the case of an inkjet print head that discharges ink at a high level of the heat enable (HE) signal, the AND circuit AND4 falls to a low level and the transistor MD4 is not driven when the output of the heat enable (HE) terminal rises to a high level. Therefore, the AND circuit AND4 outputs a high-level signal only when one of the anti-fuse elements Ca1 to Ca3 is selected and the inkjet print head is not in the discharge state. As a result, when one of the anti-fuse elements Ca1 to Ca3 is selected and the inkjet print head is not in the discharge state, the first protection resistance Rs1 and the second protection resistance Rs2 are connected in parallel, whereby the drop amount of the voltage supplied to the anti-fuse element from the VHT terminal can be reduced.

According to the second embodiment as has been described above, the drop amount of the voltage supplied to the anti-fuse element can be reduced by reducing the resistance value of the protection resistance connected between the VHT terminal and the anti-fuse element when the anti-fuse element is selected and a predetermined condition is met.

Even when one of the anti-fuse elements is selected, the second protection resistance Rs2 connected in parallel to the first protection resistance Rs1 is open while the heat enable (HE) signal is being output. Accordingly, the current limiting function of the protection resistance Rs1 of the memory unit can be sufficiently utilized when a high-voltage power source is being used (during printing).

Third Embodiment

Figure 3:
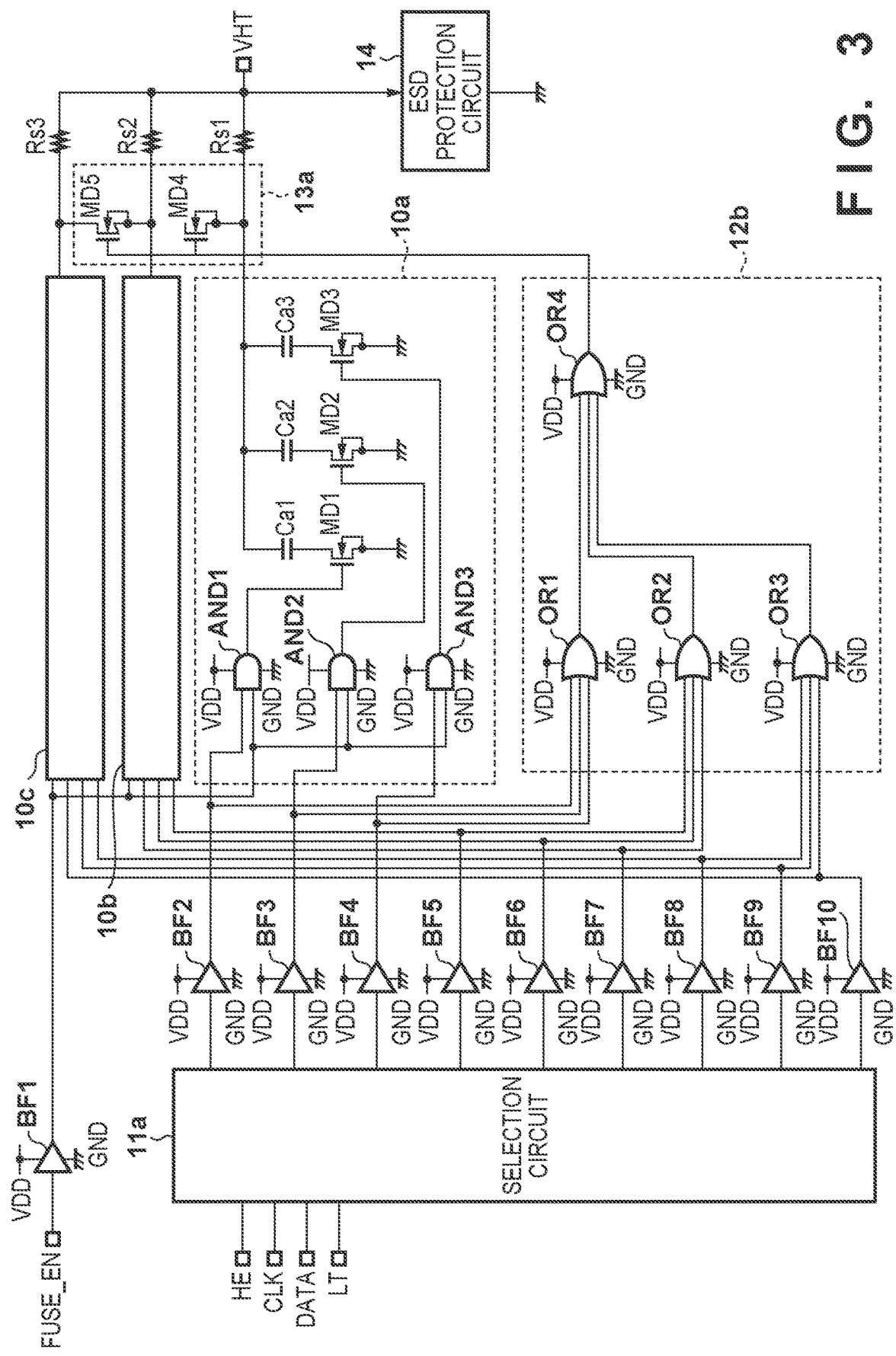
FIG. 3 is a block diagram illustrating an example of a circuit configuration of a semiconductor storage apparatus on a printing element substrate of an inkjet print head according to a third embodiment of the present invention.

FIG. 3 is a block diagram illustrating an example of a circuit configuration of a semiconductor storage apparatus on a printing element substrate of an inkjet print head according to a third embodiment of the present invention. In FIG. 3, components identical to those of FIG. 1 described above are provided with same reference numbers or reference signs, and description thereof will be omitted.

An inkjet print head according to the third embodiment includes a plurality of memory units 10a to 10c, each having the anti-fuse elements Ca1 to Ca3 connected in parallel thereto. A heat enable (HE) signal terminal, a clock signal (CLK) terminal, a data signal (DATA) terminal, and a latch signal (LT) terminal are connected to input ends of a selection circuit 11a. Based on the input signals, the selection circuit 11a controls access to each memory unit via the buffers BF2 to BF4, and controls the bypass circuit 13a via the buffers BF2 to BF10.

In FIG. 3, the fuse enable signal (FUSE_EN) is supplied to the memory units 10a to 10c via the buffer BF1. The output end of the selection circuit 11a and the fuse enable signal (FUSE_EN) output end are connected to the AND circuits AND1 to AND3 of the memory unit 10a and, an output from one of the AND circuits AND1 to AND3 in which signals from both output ends reach a high level rises to a high level. The foregoing brings one of the corresponding transistors MD1 to MD3 into conduction, which allows for writing and reading information to and from the selected anti-fuse elements Ca.

When writing information to an anti-fuse element, writing voltage is applied thereto from the VHT terminal. Between the VHT terminal and the memory units 10a to 10c, first protection resistances Rs1 to Rs3 are connected in series to respective memory units. The anti-fuse element is thus protected from a sudden high voltage that may be generated by ESD. In addition, the ESD protection circuit 14 is connected in series between the VHT terminal and the ground (GND). The ESD protection circuit 14 acts to release current to the ground (GND) when a high voltage caused by ESD is applied.

Additionally, a bypass circuit 13a is connected in parallel between the first protection resistances Rs1 and Rs2, and between the first protection resistances Rs2 and Rs3. In the bypass circuit 13a, the memory unit sides of the first protection resistances Rs1 and Rs2 are connected to each other via the transistor MD4, and the memory unit sides of the first protection resistances Rs2 and Rs3 are connected to each other via the transistor MD5. The transistors MD4 and MD5 then become conductive when a high-level signal is input from the bypass circuit control unit 12b.

The bypass circuit control unit 12b has an OR circuit OR1 that receives signals of BF2 to BF4 which are collectively the output from the selection circuit 11a, an OR circuit OR2 that receives signals of BF5 to BF7, and an OR circuit OR3 that receives signals of BF10 to BF8. The outputs of the OR circuits OR1 to OR3 are then input to the OR circuit OR4. Therefore, the bypass circuit control unit 12b outputs a high-level signal when a signal is output for selecting one of the anti-fuse elements Ca1 to Ca3. Accordingly, the transistors MD4 and MD5 become conductive regardless of which anti-fuse element is selected. As a result, selecting one of the anti-fuse elements causes all the first protection resistances Rs1 to Rs3 to be connected in parallel, whereby the drop amount of the voltage supplied to the anti-fuse elements from the VHT terminals can be reduced.

According to the third embodiment as has been described above, the drop amount of the voltage supplied to the anti-fuse element can be reduced, even when a plurality of memory units are provided, by reducing the resistance value of the protection resistance when an anti-fuse element of one of the memory units is selected.

Here, it is also conceivable to prevent the transistors MD4 and MD5 from becoming conductive while the heat enable (HE) signal is being output, by adding the components of the second embodiment to the third embodiment. The foregoing allows for fully utilizing the current limiting function of the protection resistance of the memory unit while a high-voltage power source is being used (during printing).

According to the embodiments as have been described above, a path bypassing the first protection resistance becomes conductive only when reading and writing data from and to the memory device, thereby connecting the second protection resistance and the first protection resistance in parallel. Accordingly, the combined resistance of the path for reading and writing data from and to the memory device can be reduced. As a result, there is exhibited an effect that allows stable and highly efficient reading and writing of data from and to the memory device while maintaining the ESD resistance of the memory device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-033788 filed on Mar. 4, 2022, which is hereby incorporated by reference herein in its entirety.

What is claimed is:

1. A semiconductor storage apparatus comprising a memory unit including one or more memory devices, the semiconductor storage apparatus further comprising:
   a first resistance connected in series to a power line that supplies a writing voltage to the memory unit;
   a second resistance connected in parallel to the first resistance via a drive element; and
   a control unit configured to control the drive element to be driven into conduction to allow current to flow through the first resistance and the second resistance when a memory device of the one or more memory devices of the memory unit is selected,
   wherein the one or more memory devices are anti-fuse elements, and
   the first resistance is connected in series to the one or more memory devices.

2. The semiconductor storage apparatus according to claim 1, wherein, when the one or more memory devices included in the memory unit comprise a plurality of memory devices, the control unit drives the drive element into conduction when one of the plurality of memory devices is selected.

3. The semiconductor storage apparatus according to claim 1, wherein, under a predetermined condition, the control unit does not drive the drive element into conduction even when the memory device is selected.

4. The semiconductor storage apparatus according to claim 3, wherein the predetermined condition is a condition in which a print head including the semiconductor storage apparatus is not powered.

5. The semiconductor storage apparatus according to claim 1, further comprising an ESD protection circuit including a protection resistance connected between the power line and ground.

6. A semiconductor storage apparatus comprising a plurality of memory units each including one or more memory devices, the semiconductor storage apparatus further comprising:
   a plurality of first resistances connected in series to a power line that supplies a writing voltage to each of the plurality of memory units;
   a plurality of drive elements connecting respective memory unit sides of the plurality of first resistances; and
   a control unit configured to control the plurality of drive elements to be driven into conduction when a memory device of the one or more memory devices of one of the plurality of memory units is selected,
   wherein the one or more memory devices are anti-fuse elements, and
   the plurality of first resistances are connected in series to the one or more memory devices.

7. The semiconductor storage apparatus according to claim 6, further comprising an ESD protection circuit including a protection resistance connected between the power line and ground.

8. A printing apparatus comprising a semiconductor storage apparatus including a memory unit including one or more memory devices, the printing apparatus further comprising:
   a first resistance connected in series to a power line that supplies a writing voltage of the memory unit;
   a second resistance connected in parallel to the first resistance via a drive element; and
   a control unit configured to control the drive element to be driven into conduction to allow current to flow through the first resistance and the second resistance when a memory device of the one or more memory devices of the memory unit is selected,
   wherein the one or more memory devices are anti-fuse elements, and
   the first resistance is connected in series to the one or more memory devices.

9. The printing apparatus according to claim 8, wherein, when the one or more memory devices included in the memory unit comprises a plurality of memory devices, the control unit drives the drive element into conduction when one of the plurality of memory devices is selected.

10. The printing apparatus according to claim 8, wherein, under a predetermined condition, the control unit does not drive the drive element into conduction even when the memory device is selected.

11. The printing apparatus according to claim 10, wherein the predetermined condition is a condition in which a print head of the printing apparatus is not powered.

12. The printing apparatus according to claim 8, further comprising an ESD protection circuit including a protection resistance connected between the power line and ground.

13. A printing apparatus comprising a semiconductor storage apparatus including a plurality of memory units each including one or more memory devices, the printing apparatus further comprising:
   a plurality of first resistances connected in series to a power line that supplies a writing voltage to each of the plurality of memory units;
   a plurality of drive elements connecting respective memory unit sides of the plurality of first resistances; and
   a control unit configured to control the plurality of drive elements to be driven into conduction when a memory device of the one or more memory devices of one of the plurality of memory units is selected,
   wherein the one or more memory devices are anti-fuse elements, and
   the plurality of first resistances are connected in series to the one or more memory devices.

14. The printing apparatus according to claim 13, further comprising an ESD protection circuit including a protection resistance connected between the power line and ground.

* * * * *